(12) United States Patent
Gambino et al.

(10) Patent No.: US 7,713,865 B2
(45) Date of Patent: May 11, 2010

(54) PREVENTING DAMAGE TO METAL USING CLUSTERED PROCESSING AND AT LEAST PARTIALLY SACRIFICIAL ENCAPSULATION

(75) Inventors: Jeffrey P. Gambino, Westford, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 11/160,465

(22) Filed: Jun. 24, 2005

(65) Prior Publication Data
US 2006/0292863 A1 Dec. 28, 2006

(51) Int. Cl.
*H01L 21/4763* (2006.01)
(52) U.S. Cl. .................. 438/637; 438/638; 257/774
(58) Field of Classification Search .......... 438/637, 438/687; 257/774
See application file for complete search history.

(56) References Cited

U.S. PATENT DOCUMENTS

| | | | | |
|---|---|---|---|---|
| 5,849,367 A | * | 12/1998 | Dixit et al. | 438/656 |
| 6,071,808 A | * | 6/2000 | Merchant et al. | 438/633 |
| 6,181,013 B1 | * | 1/2001 | Liu et al. | 257/762 |
| 6,358,842 B1 | | 3/2002 | Zhou et al. | |
| 6,812,126 B1 | | 11/2004 | Paranjpe et al. | |
| 2003/0045131 A1 | | 3/2003 | Verbeke et al. | |
| 2003/0232494 A1 | * | 12/2003 | Adams et al. | 438/622 |
| 2004/0124537 A1 | | 7/2004 | Takayama et al. | |
| 2004/0175921 A1 | * | 9/2004 | Cowley et al. | 438/622 |
| 2004/0251547 A1 | | 12/2004 | Wu et al. | |
| 2005/0051900 A1 | * | 3/2005 | Liu et al. | 257/757 |
| 2005/0085069 A1 | * | 4/2005 | Lin et al. | 438/638 |
| 2005/0124168 A1 | * | 6/2005 | Nagahara et al. | 438/745 |

OTHER PUBLICATIONS

Wolf S. and Taurber RN. Silicon Processing for the VLSI Era, 2000, 2nd Edition, Sunset Beach, CA: Lattice Press pp. 230-234.*
Wolf S. and Taurber RN. Silicon Processing for the VLSI Era, 2000, 2nd Edition, vol. 1, Sunset Beach, CA: Lattice Press pp. 213-216, 230-234.*

* cited by examiner

*Primary Examiner*—W. David Coleman
*Assistant Examiner*—Sonya D McCall-Shepard
(74) *Attorney, Agent, or Firm*—Richard Kotulak; Hoffman Warnick LLC

(57) ABSTRACT

Methods are disclosed for metal encapsulation for preventing exposure of metal during semiconductor processing. In one embodiment, the method includes forming an opening in a structure exposing a metal surface in a bottom of the opening, where the opening forming step occurs in a tool including at least one clustered chamber. An at least partially sacrificial encapsulation layer is then formed on the exposed metal surface in the tool to prevent reaction of the exposed metal surface with the ambient. Exposure of the metal is thereby prevented.

18 Claims, 6 Drawing Sheets

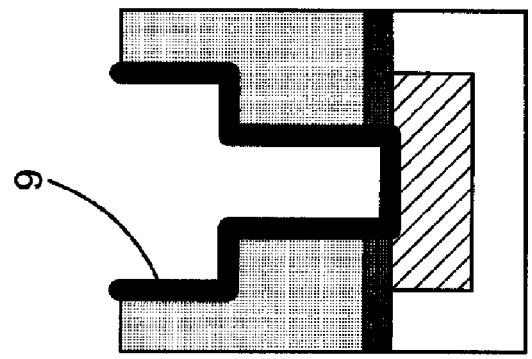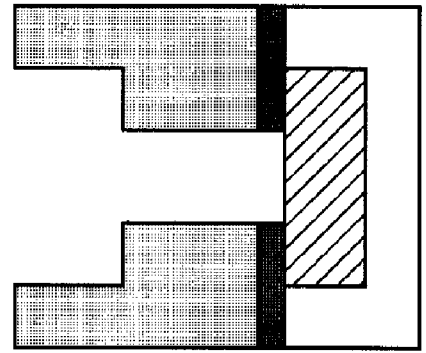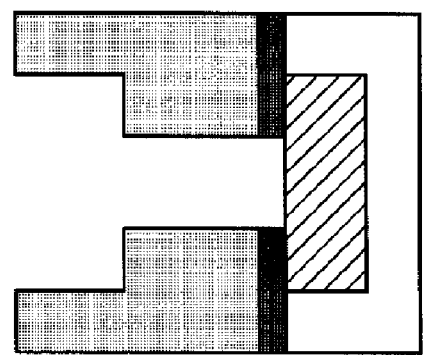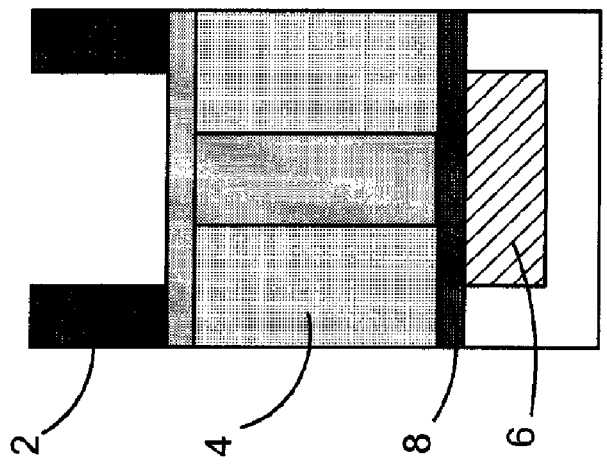

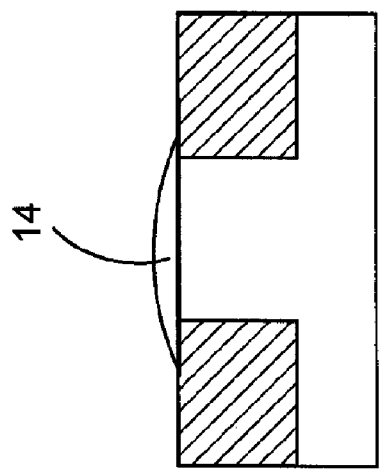
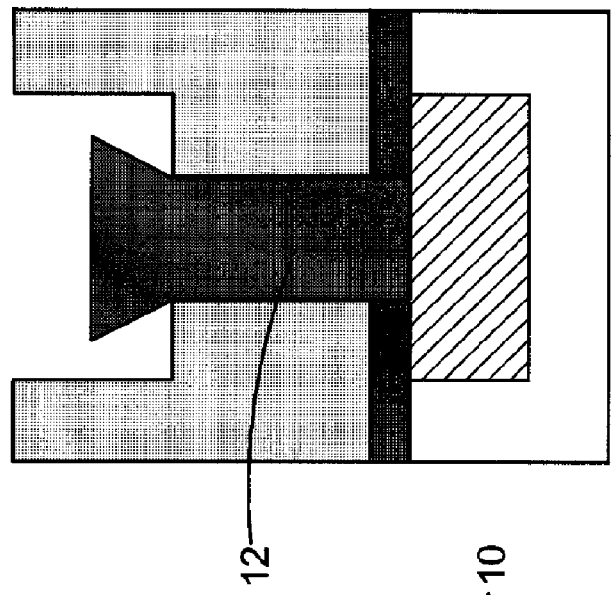
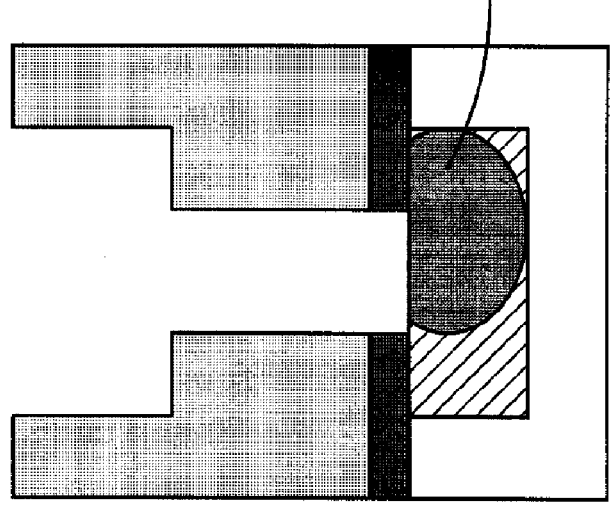
FIG. 2A Prior Art
FIG. 2B Prior Art
FIG. 2C Prior Art

PREVENTING DAMAGE TO METAL USING CLUSTERED PROCESSING AND AT LEAST PARTIALLY SACRIFICIAL ENCAPSULATION

BACKGROUND OF THE INVENTION

1. Technical Field

The present invention relates generally to semiconductor fabrication, and more particularly, to methods of preventing damage of a metal during lag times in semiconductor fabrication by using clustered processing and an at least partially sacrificial encapsulation layer.

2. Related Art

During semiconductor fabrication, metal that forms circuitry is formed in various materials. Metals such as copper (Cu) are typically lined with a liner material such as tantalum nitride, which prevents interaction of the metal with other materials. During processing, however, lag times in processing leave the metal exposed. Exposure of the metal to an ambient environment, other materials used in the processing or even adjacent dielectric structure during the lag times can cause damage to the metal. The damaged metal results in yield and reliability problems. Lag times can be created and or extended by a number of situations. For example, lag times may be created between etching steps and encapsulation of the metal with the liner. In addition, other situations such as unplanned tool down times and tool overload increases metal exposure time.

FIGS. 1A-D show one illustrative conventional process including: A) a damascene wire lithography (via first) using a mask 2 through a dielectric 4; B) metal reactive ion etching (RIE), resist stripping and silicon carbide nitrogen etching to reveal metal 6 through cap layer 8; C) a post-RIE wet cleaning; and D) liner 9 deposition. Lag times that may occur are shown in the form of arrows. FIG. 2A shows conventional metal (e.g., copper) damage in terms of corrosion 10; and FIGS. 2B and 2C show metal (e.g., copper) damage in terms of growths 12, 14 of, for example, copper oxyfluoride (CuOF) 14 and ammonium fluoride ($NH_4F$) 12. In either event, the resulting circuitry may exhibit increased via resistance, via opens, wire shorts, and degraded reliability (i.e., via resistance increase during use in the field or increased current leakage between wires). Certain intermetal dielectrics such as fluorinated silica glass (FSG), hydrogenated silicon oxycarbide (SiCOH) and porous-SiCOH especially exhibit increased metal damage.

One approach to address the exposure problem has been to implement exposure time window limitations (e.g., ~6-24 hours). Time window limitations may be applied to the durations shown by arrows in FIGS. 1A-D. Unfortunately, management of these time window limitations is expensive. In addition, other situations such as unplanned tool down times and tool overload oftentimes result in exceeding the exposure time window limitations. Furthermore, exposure time window limitations may not be adequate because yield and reliability data frequently indicates that metal damage can begin immediately upon exposure, e.g., in less than 1 hour.

In view of the foregoing, there is a need in the art for an improved solution to the metal exposure problem.

SUMMARY OF THE INVENTION

The invention includes methods for metal encapsulation for preventing exposure of metal during semiconductor processing. In one embodiment, the method includes forming an opening in a structure exposing a metal surface in a bottom of the opening, where the opening forming step occurs in a tool including at least one clustered chamber. An at least partially sacrificial encapsulation layer is then formed on the exposed metal surface in the tool to prevent reaction of the exposed metal surface with the ambient. Exposure of the metal is thereby prevented.

A first aspect of the invention is directed to a method of preventing metal exposure to ambient during semiconductor fabrication, the method comprising the steps of: forming an opening in a structure exposing a metal surface in a bottom of the opening, the opening forming step occurring in a tool including at least one clustered chamber; and forming an at least partially sacrificial encapsulation layer on the exposed metal surface in the tool to prevent reaction of the exposed metal surface with the ambient.

A second aspect of the invention includes a method of forming a back-end-of-line (BEOL) structure for a semiconductor device, the BEOL structure including copper metallurgy, the method comprising the steps of: forming a dual damascene opening in a dielectric layer to expose a copper surface at a bottom of the opening; forming an at least partially sacrificial layer on the exposed copper surface to prevent reaction of the copper surface with the ambient; at least partially removing the at least partially sacrificial layer; and forming a metal in the dual damascene opening.

A third aspect of the invention is related to a method of forming a substantially damage-free metal in a semiconductor device, the method comprising the steps of: forming a metal in a layer of the semiconductor device; forming a structure over the metal; forming an opening in the structure exposing a metal surface in a bottom of the opening, the opening forming step occurring in a tool including at least one clustered chamber; forming an at least partially sacrificial encapsulation layer on the exposed metal surface in the tool to prevent reaction of the exposed metal surface with the ambient; at least partially removing the sacrificial encapsulation layer; and forming a liner over the metal surface.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIGS. 1A-D shows a conventional process that exposes a metal surface.

FIGS. 2A-C show conventional metal damage.

DETAILED DESCRIPTION

Figure 3:
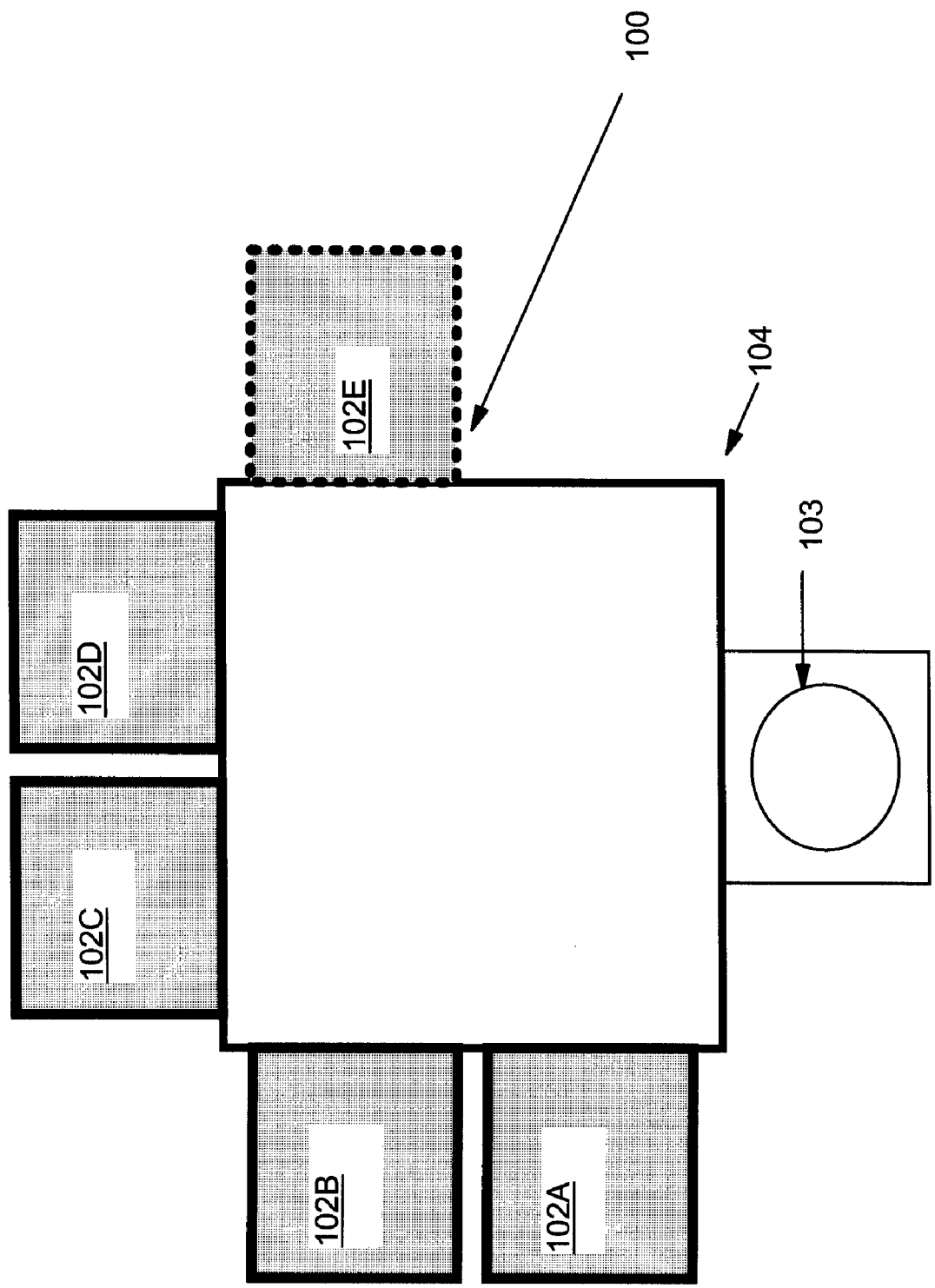
FIG. 3 shows a schematic representation of a clustered tool.

With reference to the accompanying drawings, FIG. 3 shows a schematic representation of a clustered tool 100 including at least one clustered chamber 102A-E (only five shown), including an etching chamber (e.g., 102A). Each embodiment of the invention uses clustered tool 100 such that metal is not exposed to an ambient prior to being encapsulated according to the invention. "Clustered" indicates that different chambers of the same etching tool are used and a robot handler (not shown) is used to move wafers 103 from a load lock 104 between chambers.

Turning to FIGS. 4-11, methods of preventing metal exposure to ambient during semiconductor fabrication will now be described.

Figure 4:
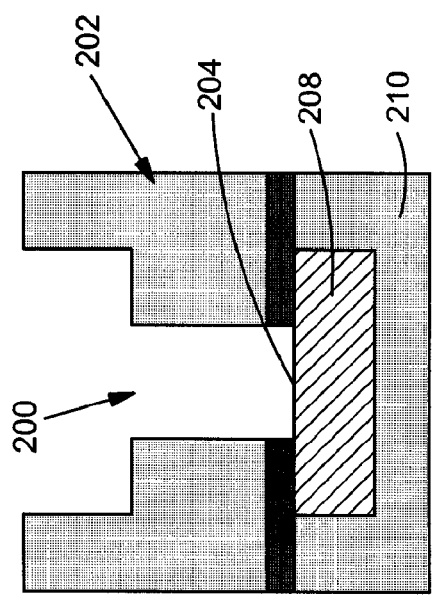
FIG. 4 shows an opening forming step according to one embodiment of the invention.

Referring to FIG. 4, in one general embodiment, a first step includes forming an opening (e.g., a dual damascene opening) 200 in a structure 202 exposing a metal surface 204 in a bottom of opening 200. Structure 202 may include any now known or later developed dielectric material such as fluorinated silica glass (FSG), hydrogenated silicon oxycarbide (SiCOH), porous-SiCOH, silicon dioxide ($SiO_2$), silicon nitride ($Si_3N_4$), etc. The opening 200 forming step may include any now known or later developed etching technique to form opening 200 including, for example, single damascene via and metal steps, or dual damascene steps. In any event, opening forming step preferably occurs in an etching chamber (e.g., 102A in FIG. 3) in tool 100 (FIG. 3). At this stage, an optional de-flourinating (DF) clean can also be performed to remove fluorine reactants, such as fluorinated photoresist residuals. The DF clean requires standard parallel plate or high density plasma radio frequency (RF) or microwave chamber configurations using either a reducing gas ambient (preferred), such as Hydrogen/Nitrogen, or an oxidizing ambient, such as Oxygen.

Figure 5:
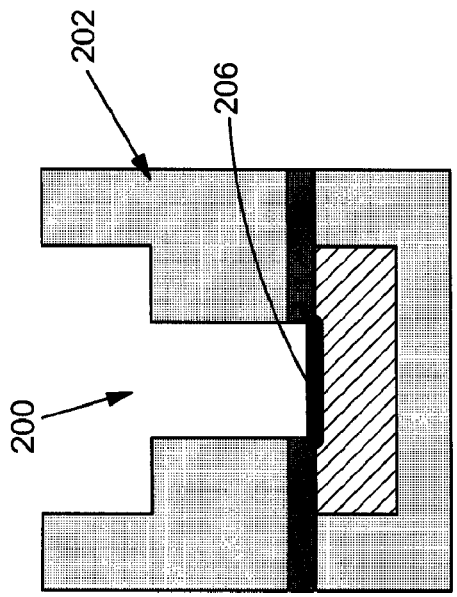
FIG. 5 shows an at least partially sacrificial encapsulation layer according to one embodiment of the invention.
Figure 6:
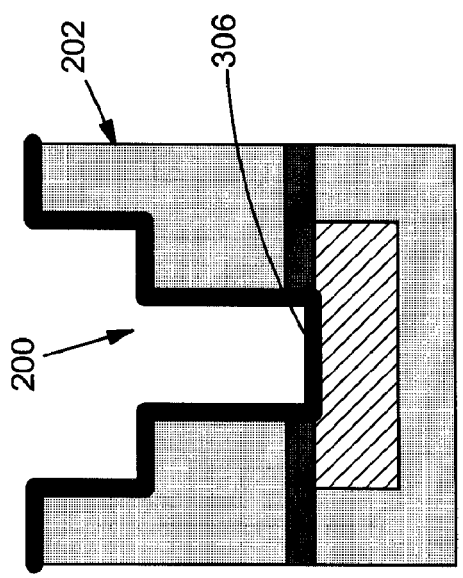
FIG. 6 shows an at least partially sacrificial encapsulation layer according to another embodiment of the invention.

In FIGS. 5 and 6, an at least partially sacrificial encapsulation layer 206, 306 is formed on exposed metal surface 204 (FIG. 4) in tool 100 (FIG. 3) to prevent reaction of exposed metal surface 204 (FIG. 4) with the ambient. (Layer 206, 306 may be referred to as a "sacrificial" layer or an "encapsulation" layer below). Encapsulation layer 206, 306 may have a thickness of, for example, approximately 1 nm to approximately 50 nm, preferably 5 nm. As shown in FIG. 5, in one embodiment, encapsulation layer 206 only covers exposed metal surface 204 (FIG. 4) in a bottom of opening 200. In contrast, in an alternative embodiment shown in FIG. 6, encapsulation layer 306 covers the entire opening 200, including exposed metal surface 204 (FIG. 4).

The encapsulation layer 206, 306 forming step shown in FIGS. 5 and 6 can be provided in a variety of ways. In one embodiment, encapsulation layer 206, 306 is formed in a clustered metal deposition chamber (e.g., 102B in FIG. 3) of tool 100 (FIG. 3), i.e., a metal deposition chamber coupled to etching chamber 102A. Thus, metal surface 204 is never exposed to ambient. In this case, the encapsulation layer forming step may include depositing a refractory metal over metal surface 204 in metal deposition chamber 102B. The refractory metal may include any conventional refractory metal used in semiconductor fabrication, e.g., tantalum (Ta), tantalum nitride (TaN), titanium nitride (TiN), etc. The deposition process may also implement any now known or later developed process such as physical vapor deposition (PVD), atomic layer deposition (ALD) and chemical vapor deposition (CVD), etc. It should be recognized that since encapsulation layer 206, 306 will ultimately be removed, either completely or only on the horizontal surfaces, the refractory metal does not have to be high quality, highly conformal or low resistance. Prior to formation of a final liner (not shown), encapsulation layer 206, 306 can be removed using a sputter or etching process during the liner preclean prior to depositing the liner. However, this step cannot occur in etching chamber 102A.

In the following alternative embodiments, encapsulation layer 206, 306 forming step occurs in etching chamber 102A, a wet cleaning chamber (e.g., 102C), or another clustered chamber (e.g., 102B or 102D) to one of etching chamber 102A and wet cleaning chamber 102C. That is, encapsulation layer 206, 306 forming step may occur in: a) etching chamber 102A or a clustered chamber 102B thereof, or b) in a wet cleaning chamber 102C or a clustered chamber 102D thereof. In either case, the clustered chamber may include, for example, a deposition chamber.

In a first alternative embodiment, metal surface 204 (FIG. 4) is heated and then exposed to silane ($SiH_4$) or germane ($GeH_4$) to form encapsulation layer 206 in the form of silicide or germanide, respectively. The heating step includes heating to a temperature of no less than approximately 300° C., preferably 400° C. This particular alternative embodiment only creates encapsulation layer 206 in a bottom of opening 200, as shown in FIG. 5. Again, encapsulation layer 206 will eventually be sputtered off prior to formation of a final liner.

In a second alternative embodiment, the encapsulation layer 206, 306 forming step includes depositing a dielectric at or near room temperature, i.e., approximately 0-150° C., for example, 25° C. The dielectric may include any now known or later developed dielectric materials such as silicon nitride ($Si_3N_4$), silicon carbo-nitride (SiCN) and silicon carbide (SiC). The depositing step may include using a carrier gas selected from, for example: silane ($SiH_4$), nitrogen ($N_2$) and ammonia ($NH_3$). In this case, the dielectric may be of low quality since it is deposited at or near room temperature, which is allowable since encapsulation layer 206, 306 will be eventually sputtered off prior to formation of a final liner. The dielectric can be deposited using any known method, such as plasma-enhanced chemical vapor deposition (PECVD), high density plasma CVD (HDPCVD), thermal CVD, or PVD.

In a third alternative embodiment, encapsulation layer 206, 306 forming step includes selectively depositing a metal on the metal surface 204 (FIG. 4) using one of metal-organic chemical vapor depositing (MOCVD) and electroplating. MOCVD is a CVD process which uses metal-organic compounds as source materials. Where the selective depositing step includes MOCVD, the metal may include, for example: tungsten (W), titanium nitride (TiN) and tantalum nitride (TaN), and may use appropriate precursors such as: titanium penta-chloride ($TiCl_5$), tungsten hexa-flouride ($WF_6$), tantalum chloride (TaCl), etc. Where the selective depositing step includes electroplating, the materials formed may include, for example: cobalt tungsten-phosphorous (CoWP) and nickel phosphorous (NiP), etc. The electroplating embodiment forms sacrificial encapsulation layer 206 only on the bottom of opening 200. Again, encapsulation layer 206, 306 will eventually be sputtered off prior to formation of a final liner.

In another alternative embodiment, where encapsulation layer 206, 306 forming step occurs in wet cleaning chamber 102C, the forming step may include exposing metal surface 204 (FIG. 4) to an electroless plating deposition in either wet cleaning chamber 102C (post wet clean) or a clustered deposition chamber (e.g., 102D) to wet cleaning chamber 102C. Where the selective depositing step includes electroless plating, the materials formed may include, for example: cobalt tungsten-phosphorous (CoWP) and nickel phosphorous (NiP), etc. The electroplating embodiments form sacrificial encapsulation layer 206 only on the bottom of opening 200. Again, encapsulation layer 206, 306 will eventually be sputtered off prior to formation of a final liner.

Figure 9:
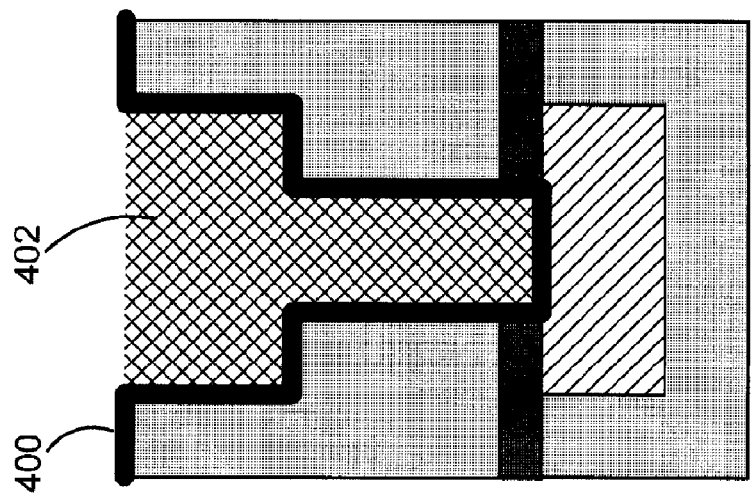
FIGS. 7-9 show removal of the encapsulation layer of FIG. 5 and subsequent steps.
Figure 8:
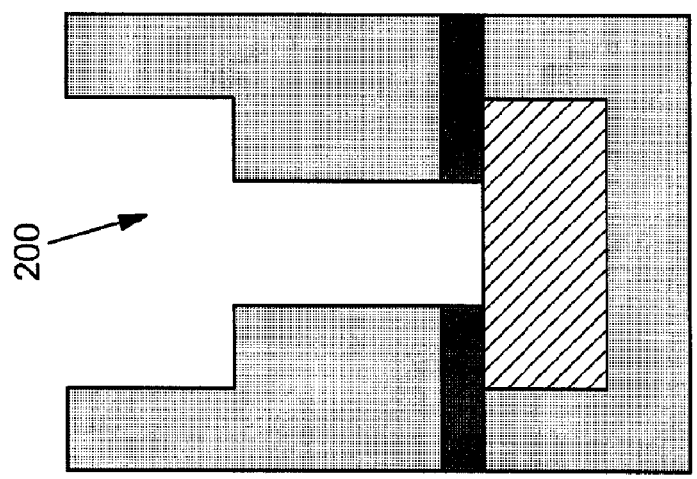
Figure 7:
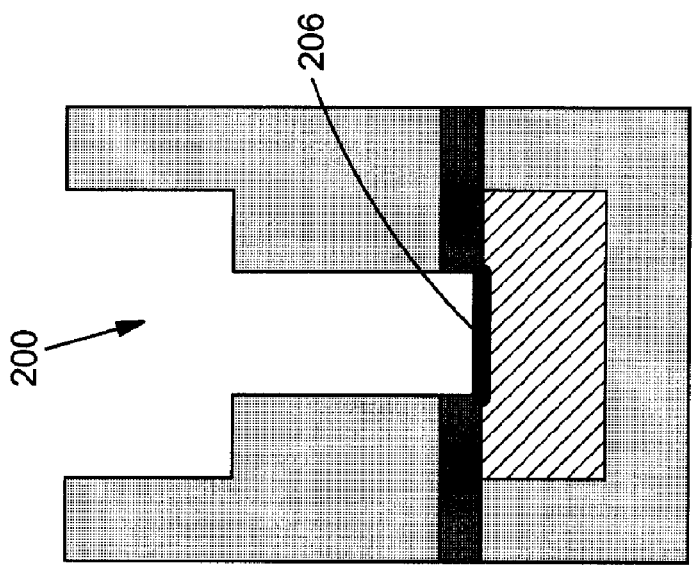
Figure 12:
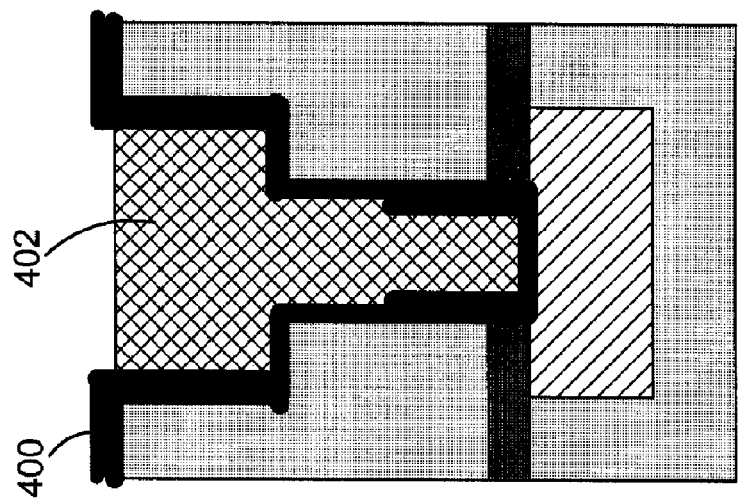
FIGS. 10-12 show removal of the encapsulation layer of FIG. 6 and subsequent steps.
Figure 11:
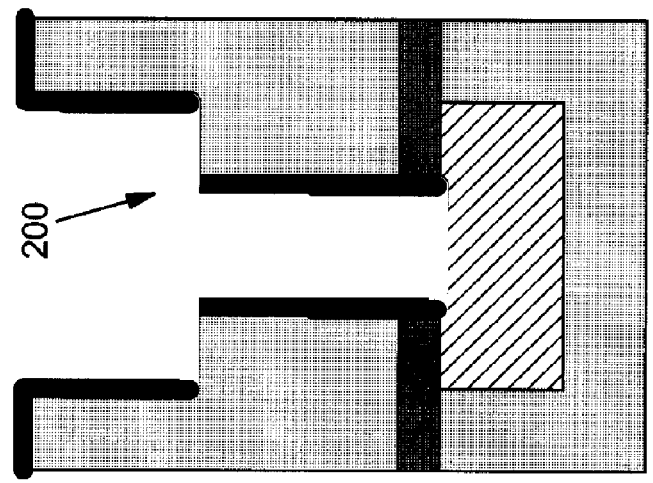
Figure 10:
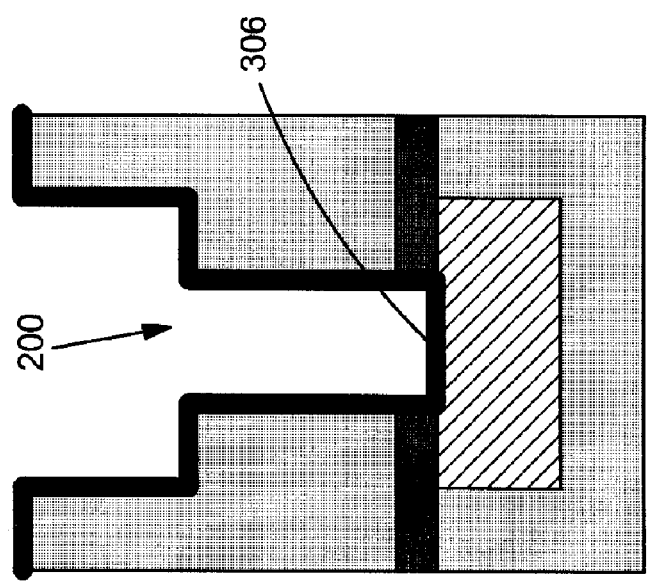

In an alternative general embodiment, the method may also include forming a back-end-of-line (BEOL) structure for a semiconductor device, the BEOL structure including copper metallurgy. In this case, the method may include forming a dual damascene opening 200 (FIG. 4) in a dielectric layer (i.e., structure 202) to expose a copper surface 204 at a bottom of opening 200. An at least partially sacrificial layer 206, 306 is formed on the exposed copper surface 204 to prevent reaction of the copper surface with the ambient. As described above, sacrificial layer 206, 306 forming step occurs in the same chamber as the dual damascene opening forming step or a clustered chamber to a chamber that the dual damascene opening forming step occurs in. FIGS. 7-8 show removal of sacrificial layer 206 from a bottom of opening 200, while FIGS. 10-11 show removal of sacrificial layer 306 from a bottom of opening 200. With regard to FIGS. 10-11, only the horizontal surfaces of opening 200 are shown having sacrificial layer 306 removed. This step may include using any now known or later developed sputtering techniques used as a liner sputter preclean prior to formation of a final liner. It should be recognized, however, if some sort of reactive preclean is implemented instead of just a sputter preclean, sacrificial layer 306 may be removed from the sidewalls also. A user may want to remove sacrificial layer 306 from the sidewalls, for example, if the layer has poor properties, which may be the case if the layer was formed at room temperature. As shown in FIGS. 9 and 12, a metal 402 is formed in dual damascene opening 200 to form the BEOL wiring. Metal 402 may be formed in any now known or later developed fashion, e.g., by depositing a conventional liner 400 and then depositing a metal 402 such as copper (Cu), as known in the art.

Another alternative general embodiment includes a method of forming a substantially damage-free metal in a semiconductor device. As shown in FIGS. 4-6, this embodiment includes forming a metal 208 (FIG. 4) in a layer 210 (FIG. 4) of semiconductor device. Next, a structure 202 is formed over metal 208. An opening 200 is then formed in structure 202 exposing a metal surface 204 in a bottom of opening 200. As described above, the opening 200 forming step may occur in a tool 100 (FIG. 3) including at least one clustered chamber 102A-E. An at least partially sacrificial encapsulation layer 206, 306 (FIGS. 5-6) is then formed on exposed metal surface 204 in tool 100 (FIG. 3) to prevent reaction of exposed metal surface 204 with the ambient.

Next, as shown in FIGS. 7-9 and FIGS. 10-12, sacrificial layer 206, 306, respectively, is at least partially removed. In particular, FIGS. 7-8 show removal of sacrificial layer 206 from a bottom of opening 200, while FIGS. 10-11 show partial removal of sacrificial layer 306 from a bottom of opening 200. With regard to FIGS. 10-11, only the horizontal surfaces of opening 200 have sacrificial layer 306 removed. This step may include using any now known or later developed etching techniques.

Finally, as shown in FIGS. 9 and 12, a liner 400 is formed over metal surface 204 and opening 200. Subsequently, opening 200 may be filled with a metal 402 to form BEOL wiring. Liner 400 and metal 402 may be formed in any now known or later developed fashion, e.g., by depositing a conventional liner 400 and then depositing a metal 402 such as copper (Cu).

Although this invention has been focused on fabricating vias to copper wires, this invention is also applicable to damascene tungsten contacts made through a pre-metal dielectric, such as silicon dioxide ($SiO_2$), boro-phospho-silica glass (BPSG) or phospho-silica glass (PSG), to front-end-of-line (FEOL) devices, such as metal-oxide semiconductor (MOS) transistor source/drain/gate areas or passive devices.

Note that, although this invention focuses on fully removing the sacrificial layer, it could also be partially removed or left unremoved if the necessary precleans were performed prior to metallization.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of preventing metal exposure to ambient during semiconductor fabrication, the method comprising:
   forming an opening in a semiconductor structure exposing a metal surface in a bottom of the opening, a second surface distinct from the metal surface, and a plurality of sidewalls, the opening forming occurring in a chamber within a tool including a plurality of clustered chambers;
   preventing reaction of the exposed metal surface, the second surface, and the plurality of sidewalls with the ambient by forming a sacrificial encapsulation layer on the exposed metal surface, the second surface, and the plurality of sidewalls, the forming of the sacrificial layer occurring in the chamber; and
   removing the sacrificial encapsulation layer from over only the metal surface and the second surface, the removing occurring in the chamber.

2. The method of claim 1, wherein the plurality of clustered chambers includes an etching chamber and a metal deposition chamber, and the encapsulation layer forming step occurs in the metal deposition chamber and includes depositing a refractory metal over the metal surface in the metal deposition chamber.

3. The method of claim 1, wherein the encapsulation layer forming step occurs in one of an etching chamber, a wet cleaning chamber and another clustered chamber in the plurality of clustered chambers, and includes:
   heating the metal surface; and
   exposing the metal surface to one of silane ($SiH_4$) and germane ($GeH_4$) to form one of silicide and germanide, respectively.

4. The method of claim 1, wherein the encapsulation layer forming step occurs in one of an etching chamber, a wet cleaning chamber and another clustered chamber in the plurality of clustered chambers, and includes:
   depositing a dielectric at or near room temperature.

5. The method of claim 1, wherein the encapsulation layer forming step occurs in one of an etching chamber, a wet cleaning chamber and another clustered chamber in the plurality of clustered chambers, and includes:
   selectively depositing a metal on the metal surface using one of metal-organic chemical vapor depositing (MOCVD) and electroplating.

6. The method of claim 1, wherein the encapsulation layer forming step occurs in a wet cleaning chamber, and includes exposing the metal surface to an electroless plating deposition in one of the wet cleaning chamber and another of the plurality of clustered chambers.

7. The method of claim 1, wherein the opening forming step includes etching to form the opening, and further comprising the step of performing a de-flourinating clean.

8. The method of claim 2, wherein the encapsulation layer forming step includes one of: plasma vapor deposition (PYD), atomic layer deposition (ALD) and chemical vapor deposition (CYD).

9. The method of claim 2, wherein the refractory metal is chosen from the group consisting of: tantalum (Ta), tantalum nitride (TaN) and titanium nitride (TiN).

10. The method of claim 3, wherein the heating step includes heating to a temperature of no less than approximately 300° C.

11. The method of claim 4, wherein the dielectric is chosen from the group consisting of: silicon nitride ($Si_3N_4$), silicon carbo-nitride (SiCN) and silicon carbide (SiC).

12. The method of claim 4, wherein the encapsulation layer forming step includes using a carrier gas selected from the group consisting of: silane ($SiH_4$), nitrogen ($N_2$) and ammonia ($NH_3$).

13. The method of claim 5, wherein the selectively depositing step includes the MOCVD of one of: tungsten (W), titanium nitride (TiN) and tantalum nitride (TaN).

14. The method of claim 5, wherein the selectively depositing step includes the electroplating of one of: cobalt tungsten-phosphorous (CoWP) and nickel phosphorous (NiP).

15. The method of claim 13, wherein the MOCVD step uses one of the group consisting of: titanium penta-chloride ($TiCl_5$), tungsten hexa-flouride ($WF_6$), tantalum chloride (TaCl).

16. A method of forming a back-end-of-line (BEOL) structure for a semiconductor device, the method comprising:
    forming a dual damascene opening in a dielectric layer of a semiconductor structure to expose a copper surface at a bottom of the opening, a second surface distinct from the copper surface, and a plurality of sidewalls;
    preventing reaction of the copper surface with an ambient by forming a sacrificial layer directly on the exposed copper surface, the second surface, and the plurality of sidewalls, wherein the sacrificial layer forming occurs in the same chamber as the dual damascene via forming;
    removing the sacrificial layer from over only the copper surface and the second surface, wherein the removing occurs in the same chamber as the dual damascene via forming; and
    forming a metal in the dual damascene opening to form a BEOL structure for a semiconductor device, the BEOL structure including copper metallurgy.

17. A method of forming a substantially damage-free metal in a semiconductor device, the method comprising:
    forming a metal in a layer of the semiconductor device;
    forming a structure over the metal;
    forming an opening in the structure exposing a surface of the metal in a bottom of the opening, a second surface distinct from the metal surface, and a plurality of sidewalls, the opening forming occurring in a clustered chamber within a tool including a plurality of clustered chambers;
    preventing reaction of the exposed metal surface, the second surface, and the plurality of sidewalls with an ambient by forming a sacrificial encapsulation layer on the exposed metal surface, the second surface, and the plurality of sidewalls in the tool, wherein the sacrificial layer forming occurs in the same chamber as the opening forming step;
    removing the sacrificial encapsulation layer from over only the surface of the metal and the horizontal surface, wherein the removing occurs in the same chamber as the opening forming step; and
    forming a liner over the metal surface.

18. The method of claim 17, wherein the clustered chamber includes one of: a wet cleaning chamber and a deposition chamber.

* * * * *